(12) United States Patent
Lee et al.

(10) Patent No.: US 7,348,903 B2
(45) Date of Patent: *Mar. 25, 2008

(54) METHOD AND APPARATUS FOR ENHANCING PERFORMANCE OF ENTROPY CODING, AND VIDEO CODING METHOD AND APPARATUS USING THE ENTROPY CODING PERFORMANCE ENHANCING METHOD

(75) Inventors: Bae-keun Lee, Bucheon-si (KR); Woo-jin Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/486,175

(22) Filed: Jul. 14, 2006

(65) Prior Publication Data

US 2007/0069926 A1    Mar. 29, 2007

Related U.S. Application Data

(60) Provisional application No. 60/719,967, filed on Sep. 26, 2005.

(30) Foreign Application Priority Data

Jan. 11, 2006    (KR) .................. 10-2006-0003321

(51) Int. Cl.
*H03M 7/40*    (2006.01)
(52) U.S. Cl. ......................... 341/67; 341/106
(58) Field of Classification Search .............. 341/67, 341/65, 50, 59, 58, 106
See application file for complete search history.

(56) References Cited

U.S. PATENT DOCUMENTS 4,630,030 A * 12/1986 Roy .............................. 341/95

(Continued)

FOREIGN PATENT DOCUMENTS

WO    WO 03/084242 A2    10/2003

OTHER PUBLICATIONS

Justin Ridge, et al., "Variable Length Codes for SVC", Jul. 24-29, 2005, pp. 1-7, USA.

(Continued)

*Primary Examiner*—Peguy JeanPierre
(74) *Attorney, Agent, or Firm*—Sughrue Mion, PLLC (57) ABSTRACT

A method and apparatus for enhancing the performance of entropy coding in a multilayer-based codec system are provided. In a variable length coding method for lossless-coding first coefficients among coefficients of a discrete layer and one or more fine granular scalability (FGS) layers, the variable length coding method includes determining a proportion of zeros included in a predetermined unit region to which the first coefficients belong, selecting one of a plurality of grouping units depending on whether or not the proportion exceeds a predetermined threshold, grouping absolute values of the first coefficients using the selected grouping unit, and transforming the grouped absolute values into a code word mapped thereto by referring to a VLC table corresponding to the selected group unit.

18 Claims, 4 Drawing Sheets

U.S. PATENT DOCUMENTS 6,646,578 B1    11/2003    Au
6,690,307 B2    2/2004    Karczewicz
6,696,991 B2 *    2/2004    Shim et al. .................... 341/58

OTHER PUBLICATIONS

Iain E G Richardson, "H.264/MPEG-4 Part 10 White Paper", Oct. 17, 2002, pp. 1-7.

Ngai-Man Cheung, et al. "ITU-Telecommunications Standardization Sector" Jan. 9-12, 2001, pp. 1-11, Germany.

Marpe, D., "Context-based adaptive binary arithmetic coding in the H.264/AVC video compression standard," IEEE Transactions on Circuits and Systems for Video Tech., vol. 13, Issue 7, pp. 620-636, Jul. 2003.

Ohm, et al., "Advances in scalable video coding," Proc. of the IEEE, vol. 93, No. 1, pp. 42-56, Jan. 2005.

* cited by examiner

METHOD AND APPARATUS FOR ENHANCING PERFORMANCE OF ENTROPY CODING, AND VIDEO CODING METHOD AND APPARATUS USING THE ENTROPY CODING PERFORMANCE ENHANCING METHOD

CROSS-REFERENCE TO RELATED APPLICATIONS

This application claims priority from Korean Patent Application No. 10-2006-0003321 filed on Jan. 11, 2006 in the Korean Intellectual Property Office, and U.S. Provisional Patent Application No. 60/719,967 filed on Sep. 26, 2005 in the United States Patent and Trademark Office, the disclosures of which are incorporated herein by reference in their entirety.

BACKGROUND OF THE INVENTION

1. Field of the Invention

Apparatuses and methods consistent with the present invention relate to a video coding technique, and more particularly, to a method and apparatus of enhancing the performance of entropy coding in a multilayer-based codec system.

2. Description of the Related Art

With the development of information communication technology, including the Internet, there have been increasing multimedia services containing various kinds of information such as text, video, audio and so on. Multimedia data requires a large capacity of storage media and a wide bandwidth for transmission since the amount of multimedia data is usually large. Accordingly, a compression coding method is a requisite for transmitting multimedia data including text, video, and audio.

A basic principle of data compression lies in removing data redundancy. Data may be compressed by removing spatial redundancy in which the same color or object is repeated in an image, temporal redundancy in which there is little change between adjacent frames in a moving image or the same sound is repeated in audio, or mental visual redundancy taking into account human eyesight and limited perception of high frequency. In general video coding, temporal redundancy is removed by temporal filtering based on motion compensation, and spatial redundancy is removed by spatial transformation.

Redundancy-removed data is again subjected to quantization for lossy coding using a predetermined quantization step. The quantized data is finally subjected to entropy coding for lossless coding.

Standardization work for implementation of multilayer-based coding techniques using the H.264 standard is being actively pursued at present by a joint video team (JVT) of ISO/IEC (International Organization for Standardization/International Electrotechnical Commission) and ITU (International Telecommunication Union).

Entropy coding techniques currently being used in the H.264 standard include CAVLC (Context-Adaptive Variable Length Coding), CABAC (Context-Adaptive Binary Arithmetic Coding), and Exp_Golomb (exponential Golomb).

Table 1 shows entropy coding techniques used for each to-be-coded parameter under the H.264 standard.

TABLE 1

| Coded parameter | entropy_coding_mode = 0 | entropy_coding_mode = 1 |
|---|---|---|
| Macroblock_type Macroblock_pattern Quantization parameter Reference frame index Motion vector | Exp_Golomb | CABAC |
| Residual data | CAVLC | |

According to Table 1, if entropy_coding_mode flag is 0, Exp_Golomb is used in coding the macroblock type indicating whether a corresponding macroblock in an inter-prediction mode or intra-prediction mode, the macroblock pattern specifying the types of a subblocks that form a macroblock, the quantization parameter which is an index to determine a quantization step, the reference flame index specifying the frame number which is referred to in an inter-prediction mode, and the motion vector, while CAVAC is used in coding the residual data defining a difference between an original image and a predicted image.

Meanwhile, if entropy_coding_mode flag is 1, all the parameters are coded by CABAC.

Since CABAC exhibits high performance with respect to a parameter having high complexity, VLC (Variable Length Coding) based entropy coding, e.g., CAVLC, is set as a basic profile.

A new VLC technique that takes SVC characteristics into consideration has been proposed in an article by J. Ridge and M. Karczewicz, entitled "Variable length code for SVC", Poznan, in the 16th JVT meeting (JVT-P056). In JVT-P056, the same procedure as in the H.264 standard is used in a discrete layer, while VLC techniques based on different probability characteristics are used in FGS layers.

Three scanning passes supported by the JSVM (Joint Scalable Video Model) for performing fine granular scalability (FGS) encoding are significance pass, refinement pass, and remainder pass. The respective scanning passes are subjected to different VLC techniques due to their respective probability characteristics. For example, upon the finding of the fact that zero coefficients are more preferred in the refinement pass for entropy coding, a VLC table is used during entropy coding.

JVT-P056 proposed a VLC technique for FGS layers. According to the proposed VLC technique, during coding of refinement coefficients (refinement bits) in a refinement pass, every four refinement bits, suggesting the use of a fixed number of refinement bits, are grouped as a group to form a symbol, which is then coded using a single VLC table. This technique is, however, not an efficient coding technique in view of the fact that the FGS layers have different distributions of zeros in the respective FGS layers.

Figure 1:
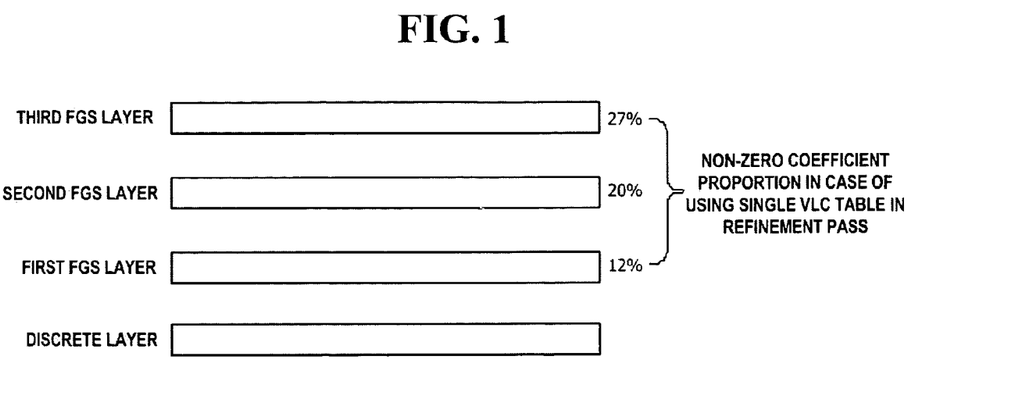
FIG. 1 illustrates non-zero proportions for each fine granular scalability (FGS) layers in case of using a single VLC table in a refinement pass.

FIG. 1 illustrates non-zero proportions for each fine granular scalability (FGS) layer when a single VLC table is used in a refinement pass. Referring to FIG. 1, for a higher enhancement layer, the number of non-zero coefficients in a coded block tends to increase up to 15%. On the other hand, the number of zero coefficients decreases up to 15%. Thus, on the assumption that there are many more zero coefficients than non-zero coefficients, the method of grouping every four refinement coefficients is not efficient for upper FGS layers except for the first FGS layer. From the viewpoint of coding performance, it is necessary to apply different grouping units and VLC tables adaptively according to characteristics of the respective FGS layers.

SUMMARY OF THE INVENTION

In view of the above, an aspect of the present invention provides a method and apparatus for enhancing the performance of entropy coding by allowing a grouping unit and a variable length coding (VLC) table corresponding thereto to be adaptively selected according to characteristics of each fine granular scalability (FGS) layer in a refinement pass among scanning passes.

The above stated aspect as well as other aspects, features and advantages of the present invention will become clear to those skilled in the art upon review of the following description.

According to an aspect of the present invention, there is provided a variable length coding method for losslesscoding first coefficients among coefficients of a discrete layer and one or more fine granular scalability (FGS) layers, the method including determining a proportion of zeros included in a predetermined unit region to which the first coefficients belong, selecting one of a plurality of grouping units depending on whether or not the proportion exceeds a predetermined threshold, grouping absolute values of the first coefficients using the selected grouping unit, and transforming the grouped absolute values into a code word mapped thereto by referring to a VLC table corresponding to the selected group unit.

According to another aspect of the present invention, there is provided a variable length decoding method for decoding first coefficients of a fine granular scalability (FGS) layer in input bitstreams by losslessly decoding a first bitstream of the FGS layer, the method including determining a proportion of zeros included previously decoded second coefficients in a predetermined unit region to which the first coefficients belong, selecting one of a plurality of grouping units depending on whether or not the proportion exceeds a predetermined threshold, and decoding the first coefficients from a code word included in the first bitstream by referring to a VLC table corresponding to the selected group unit.

According to still another aspect of the present invention, there is provided a variable length decoding method for decoding refinement coefficients of a fine granular scalability (FGS) layer in input bitstreams by losslessly decoding a first bitstream of the FGS layer, the method including reading information about a grouping unit interleaved into the first bitstream for each predetermined unit region, fetching a VLC table corresponding to the grouping unit, and decoding the first coefficients from a code word included in the first bitstream by referring to the VLC table corresponding to the group unit.

According to yet another aspect of the present invention, there is provided a variable length coding apparatus for lossless-coding first coefficients among coefficients of a discrete layer and one or more fine granular scalability (FGS) layers, the apparatus including means that determines a proportion of zeros included in a predetermined unit region to which the first coefficients belong, means that selects one of a plurality of grouping units depending on whether the proportion exceeds a predetermined threshold or not, means that groups absolute values of the first coefficients using the selected grouping unit, and means that transforms the grouped absolute values into a code word mapped thereto by referring to a VLC table corresponding to the group unit.

According to still yet another aspect of the present invention, there is provided a variable length decoding apparatus for decoding first coefficients of a fine granular scalability (FGS) layer in input bitstreams by losslessly decoding a first bitstream of the FGS layer, the apparatus including means that determines a proportion of zeros included in previously decoded second coefficients in a predetermined unit region to which the first coefficients belong, means that selects one of a plurality of grouping units depending on whether or not the proportion exceeds a predetermined threshold, and means that decodes the first coefficients from a code word included in the first bitstream by referring to a VLC table corresponding to the selected group unit.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

In general, the number of zeros becomes larger in the higher layer than in the lower layer among a plurality of FGS layers. Even in one FGS layer, the distribution in the number of zeros is not the same by frame, slice, macroblock, or block. Accordingly, the present invention allows a grouping unit and a variable length coding (VLC) table corresponding thereto to be adaptively selected on the basis of the number of zeros included in a unit region, e.g., frame, slice, macroblock, or block. Here, the grouping unit means the number of refinement bits forming a symbol.

Figure 2:
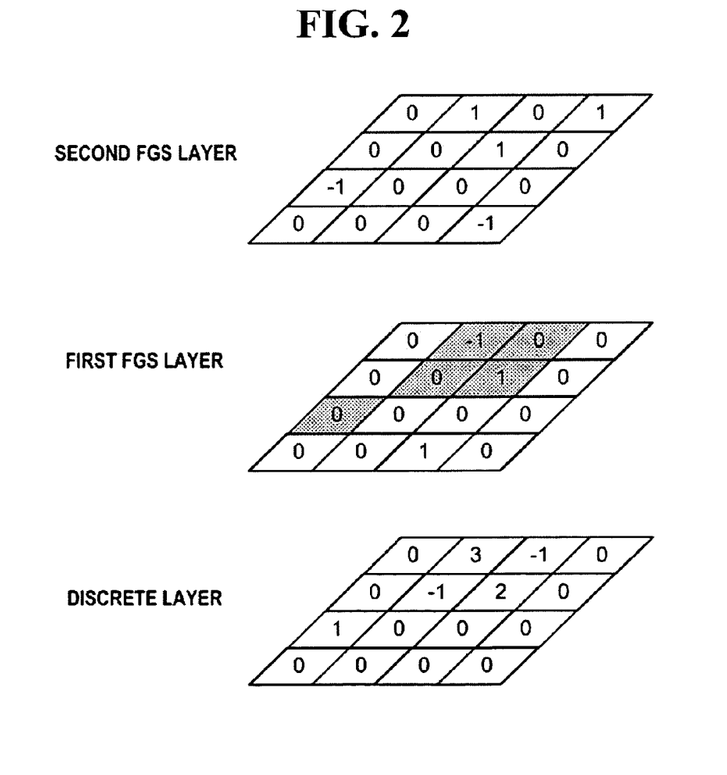
FIG. 2 illustrates an example of separately representing quantization coefficients in a discrete layer and one or more FGS layers.

FIG. 2 illustrates an example of separately representing quantization coefficients in a discrete layer and one or more FGS layers.

Referring to FIG. 2, each layer is indicated by blocks each having 4×4 coefficients. Values labeled at corresponding locations are combined to represent a quantization coefficient. A reduction of a bit rate can be achieved by truncating the layers from the highest FGS layer. In this case, only some of the coefficients in a layer may be truncated.

For example, in 4×4 blocks in each layer, coefficients located at the second row of the first column are 3, −1, and 1. In order to properly decode quantization coefficients of the corresponding locations, all the coefficients located thereat are necessary. However, in some instances, 1, or 1 and −1 may be truncated, and only coefficients of the lower layer are used in a decoder to decode the quantization coefficients. Of course, in this instance, a loss is generated.

The FGS layers and the discrete layer are quite different in their characteristics. While the discrete layer expresses even roughly an original image, the FGS layers express difference values. In addition, while values other than the values of 0, 1, and −1 are expressed in the discrete layer, only the values of 0, 1, and −1 are expressed in the FGS layers.

The coefficients of the FGS layers are coded in the significance pass when the corresponding coefficient of the discrete layer is 0, and the coefficients of the FGS layers are coded in the refinement pass when the corresponding coefficient of the discrete layer is not 0. For example, in FIG. 2, shaded bits in the first FGS layer, i.e., refinement bits, are coded in the refinement pass.

The adaptive VLC method according to the present invention is particularly suitably adopted for the refinement pass. In a case of VLC-coding coefficients of a discrete layer, both levels and trailing ones should be encoded. However, in a case of VLC-coding refinement coefficients, since the levels and trailing ones are not necessarily taken into consideration, it is advantageous and desirable to employ a more efficient, simple VLC method.

Figure 3:
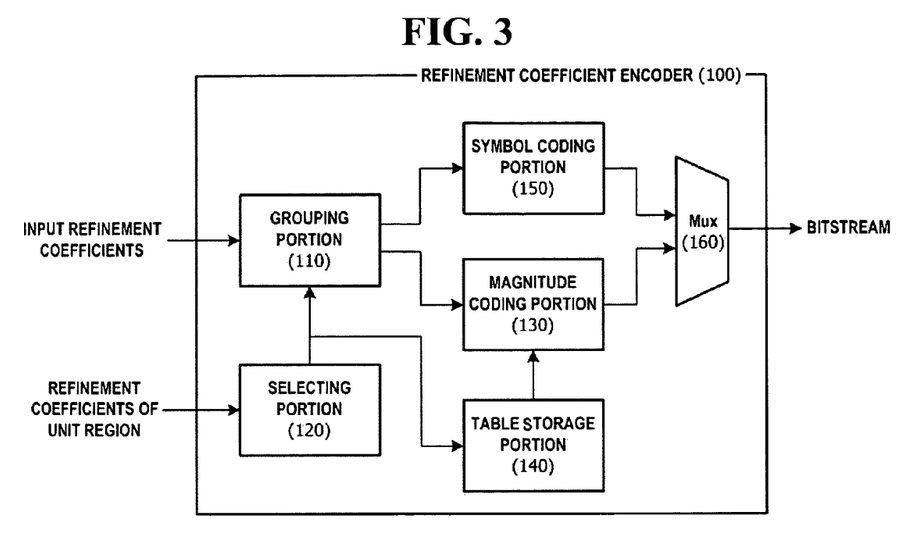
FIG. 3 is a block diagram of a refinement bit encoder in accordance with one embodiment of the present invention.

FIG. 3 is a block diagram of a refinement bit encoder 100 in accordance with one embodiment of the present invention.

A selecting portion 120 determines a grouping unit to be used in the grouping portion 110 by referring to the refinement bit of the previously coded unit region. The unit region may be a frame, a slice, a macro block, or a block to which the input refinement bit belongs.

Once a unit region of a current refinement bit is determined, the selecting portion 120 counts the number of zeros in bits of the unit region. If the proportion of zeros in the bits of the unit region exceeds a predetermined threshold, the grouping unit is set to 4, as proposed in the JVT-P056. However, if the proportion of zeros in the bits of the unit region does not exceed the predetermined threshold, the grouping unit is set to 3. If quite a large number of zeros occur in the bits to be coded, several zeros may be grouped and expressed as a short code word. Accordingly, it is advantageous to set the grouping unit to a relatively large number. Conversely, if the number of zeros occurring in the bits to be coded is small, the grouping unit is advantageously set to a relatively small number. Upon consideration of the foregoing, the selecting portion 120 of the present invention is configured to adjustably select a grouping unit.

In the above-described embodiment of the present embodiment, one threshold and two grouping units are used by way of example, but the present invention is not limited thereto. It will be understood by those of ordinary skill in the art that n thresholds and n+1 grouping units can be generally used, where n is a natural number. The thresholds can be empirically or experimentally determined values, for example, 7/8, 3/4, or 2/3. Once the grouping unit is determined, the selecting portion 120 supplies the magnitude coding portion 130 with the corresponding VLC table selected among the VLC tables stored in the table storage portion 140. If the grouping unit is changed, the VLC table should vary accordingly.

When the grouping unit is 4, a VLC table proposed in the JVT-P056, i.e., Table 2, is supplied to the magnitude coding portion 130. When the grouping unit is 3, a VLC table proposed in the present invention, i.e., Table 3, is supplied to the magnitude coding portion 130. In Tables 2 and 3, the symbol is the absolute value of a string grouped by every four refinement bits, and the code word is a mapping result of the symbol.

TABLE 2

| Symbol | Code word | Symbol | Code word |
|--------|-----------|--------|-----------|
| 0000   | 00        | 1000   | 101       |
| 0001   | 010       | 1001   | 11011     |
| 0010   | 011       | 1010   | 11100     |
| 0011   | 11000     | 1011   | 111101    |
| 0100   | 100       | 1100   | 11101     |
| 0101   | 11001     | 1101   | 111110    |
| 0110   | 11010     | 1110   | 1111110   |
| 0111   | 111100    | 1111   | 1111111   |

TABLE 3

| Symbol | Code word |
|--------|-----------|
| 000    | 00        |
| 001    | 01        |
| 010    | 10        |
| 011    | 011       |
| 100    | 100       |
| 101    | 101       |
| 110    | 1101      |
| 111    | 11110     |

Meanwhile, input refinement bits to be coded are input to the grouping portion 110. The grouping portion 110 groups the input refinement bits into groups using a grouping unit supplied from the selecting portion 120. The absolute value (1 or 0) of the grouped refinement bits is supplied to the magnitude coding portion 130, and symbols of the respective refinement bits (excluding 0) are supplied to the symbol coding portion 150.

The table storage portion 140 stores VLC tables and supplies the magnitude coding portion 130 with a VLC table corresponding to the grouping unit selected by the selecting portion 120. The table storage portion 140 may be a non-volatile memory such as ROM, PROM, EPROM, EEPROM, flash memory, etc., a volatile memory such as RAM, a storage medium such as a hard disk, or any other medium which is suitable for this purpose.

The magnitude coding portion 130 transforms the absolute value, that is, a symbol, of the grouped refinement bits supplied from the grouping portion 110 into a code word, by referring to the VLC table supplied from the table storage portion 140. The symbol coding portion 150 codes the symbol supplied from the grouping portion 110 into a 1-bit symbol code. Generally, the symbol code with a positive symbol is coded into 0 and the symbol code with a negative symbol is coded into 1.

Finally, the multiplexer (Mux) 160 multiplexes a set of code words output from the magnitude coding portion 130 and a set of code words output from the symbol coding portion 150 to generate a bitstream. For example, assuming that a refinement bit set to be encoded is {−1, 0, 1, 1, 0, 0, 1, −1}, a refinement bit encoding process will now be described.

If the proportion of zeros in the refinement bits of the unit region does not exceed a predetermined threshold, the proportion selecting portion 120 selects the grouping unit as 3. Here, the grouping portion 110 groups a set of the refinement bits into several groups each consisting of three bits, and the absolute values 101, 100, and 110, 11 preceded by 0 added to adjust the unit of the number of zeros, are supplied to the magnitude coding portion 130, and the symbols {−, +, +, +, −} are supplied to the symbol coding portion 150, respectively.

The magnitude coding portion 130 receives a VLC table, i.e., Table 3, from the table storage portion 140, and transforms the 101, 100, and 110 into a corresponding code word by referring to Table 3. As a result, a value 1011001101 is output from the magnitude coding portion 130 and input to the Mux 160. Meanwhile, the symbol coding portion 150 transforms the symbols {−, +, +, +, −} into a code word 10001. The transformation result 10001 may further be run-level coded. Then, the Mux 160 multiplexes 1011001101 with 10001 and outputs a multiplexing result.

If the proportion of zeros in the refinement bits of the unit region exceeds a predetermined threshold, the proportion selecting portion 120 selects the grouping unit as 4. Here, the grouping portion 110 groups a set of the refinement bits into several groups each consisting of four bits, and the absolute values 1011, and 0011 are supplied to the magnitude coding portion 130, and the symbols {−, +, +, +, −} are supplied to the symbol coding portion 150, respectively.

The magnitude coding portion 130 receives a VLC table, i.e., Table 2, from the table storage portion 140, and transforms the absolute values 1011 and 0011 into corresponding code words by referring to Table 2. As a result, a value 11110111000 is output from the magnitude coding portion 130 and input to the Mux 160. Meanwhile, the symbol coding portion 150 transforms the symbols {−, +, +, +, −} into a code word 10001. The transformed result 10001 may further be run-level coded. Then, the Mux 160 multiplexes 11110111000 with 10001 and outputs a multiplexing result.

Figure 4:
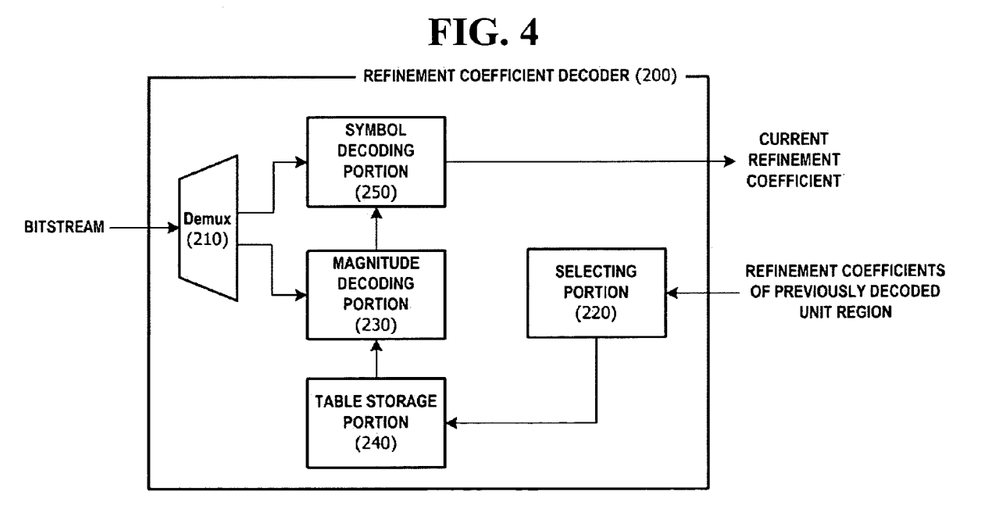
FIG. 4 is a block diagram of a refinement bit decoder in accordance with one embodiment of the present invention.

FIG. 4 is a block diagram of a refinement bit decoder 200 in accordance with one embodiment of the present invention, the refinement bit decoder 200 corresponding to the refinement bit encoder 100 shown in FIG. 3. Referring to FIG. 4, input bitstreams are separated into a set of code words and a set of symbol codes by a demultiplexer (Demux) 210. The set of code words and the set of symbol codes are supplied to a magnitude decoding portion 230 and a symbol decoding portion 250, respectively.

Like the refinement bit encoder 100, a selecting portion 220 counts a proportion of zeros in refinement bits of the previously decoded unit region and selects one of two grouping units depending on whether the proportion of zeros in the refinement bits of the unit region exceeds a predetermined threshold or not. Of course, a plurality of grouping units may be set. For example, the selecting portion 220 may select three or more grouping units.

The magnitude decoding portion 230 reads the VLC table corresponding to the selected grouping unit, i.e., Table 2 or 3, from the table storage portion 240, and continues to read bits of the set of the code word until the same value as any one of code words of the VLC table occurs. If a given number of the bits read from the VLC table is the same as a certain code word, a symbol corresponding to the certain code word is decoded.

The decoded symbol is supplied to the symbol decoding portion 250. Then, the symbol decoding portion 250 reads the symbol codes supplied from the Demux 210 one by one, and sequentially assigns symbols corresponding to the symbol codes among symbols supplied from the magnitude decoding portion 230 to non-zero symbols, i.e., 1. In such a manner, the current refinement bits are decoded from the bitstream.

For example, assume that the bitstream applied to the refinement bit decoder 200 is 1111011100010001. The Demux 210 separates 11110111000 and 10001 from the bitstream to then be supplied to the magnitude decoding portion 230 and the symbol decoding portion 250, respectively. Meanwhile, the selecting portion 220 confirms that the number of zeros in the refinement bits of the previously restored unit region exceeds a predetermined threshold and causes the table storage portion 240 to supply the magnitude decoding portion 230 with the VLC table, i.e., Table 2.

The magnitude decoding portion 230 reads the bitstream 11110111000 one bit by one bit until the same code word as any one of the code words listed in Table 2 occurs. As there is no code word identical with one of the code words listed in Table 2 until the code word 11110 is encountered, the magnitude decoding portion 230 checks with the next code word 111101. Since the same code word 111101 is listed in Table 2, the corresponding symbol 1011 is decoded. In the same manner, 0011 is decoded from the remaining bits 11000. As a result, a value 10110011 is output from the magnitude decoding portion 230 and input to the symbol decoding portion 250. The symbol decoding portion 250 decodes symbols {−, +, +, +, −} corresponding to the value 10001 supplied from the magnitude decoding portion 230, and assigns the same to non-zero values among input bits 10110011. Finally, the first input to the encoder 100, i.e., the set of the refinement bits {−1, 0, 1, 1, 0, 0, 1, −1} is decoded.

In the foregoing description, the refinement bit decoder 200 selects one of a plurality of grouping units in a similar process to that of the encoder 100, but the invention is not limited thereto. Since a part of an FGS layer may be truncated before being transmitted to the refinement bit decoder 200, different grouping units may be selected at an encoder and a decoder using ambient characteristics within a unit region containing a current block.

Accordingly, in another embodiment of the present invention, the grouping unit selected in the refinement bit encoder 100 is interleaved into a bitstream and transmitted to the refinement bit decoder 200. The grouping unit may be selected in a unit region, that is, in units of frames, slices, macroblocks, or blocks. However, when a VLC table is selected in too small of a unit region, transmission overhead may become large. Thus, the unit region is preferably in units of slices or macroblocks. In this case, a token for indicating the selected VLC table may be transmitted in a slice header or a macroblock header.

After receiving the bitstream having the token, the refinement bit decoder 200 can fetch the VLC table corresponding to the grouping unit directly from the table storage portion 240. Thus, the selecting portion 220 may not be provided.

Figure 5:
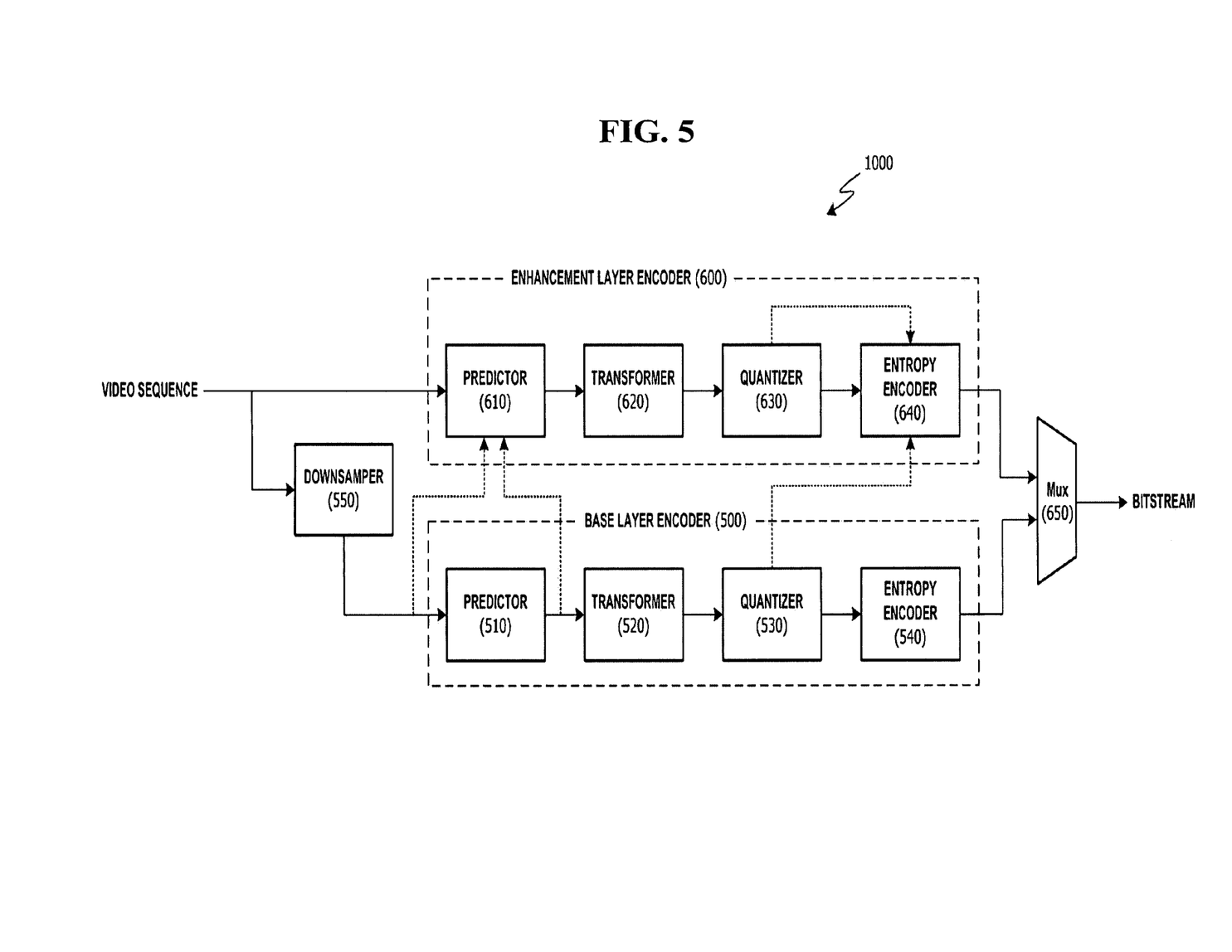
FIG. 5 is a block diagram of an FGS video encoder in which an entropy encoder shown in FIG. 3 may be employed.

FIG. 5 is a block diagram of an FGS video encoder 1000 in which an entropy encoder as shown in FIG. 3 can be employed.

An original video sequence is input into an enhancement layer encoder 600. Also, when there is a difference in the resolution between layers, the original video sequence is subjected to downsampling by a downsampler 550 and the downsampled video sequence is input to a base layer encoder 500.

A predictor 610 subtracts an image predicted using a predetermined prediction technique from a current macroblock to obtain a residual signal. Directional intra-prediction, inter-prediction, intra-BL prediction, and residual prediction may be used for prediction.

A transformer 620 transforms the residual signal into a transform coefficient using a spatial transform such as Discrete Cosine Transform (DCT) or wavelet transform.

A quantizer 630 quantizes the transform coefficient using a predetermined quantization step (as a quantization step size increases, the level of data loss or compression ratio increases) to generate a quantization coefficient.

The base layer encoder 500 includes a predictor 510, a transformer 520, and a quantizer 530 having the same functions as their counterparts in the enhancement layer encoder 600. However, unlike the predictor 610, the predictor 510 cannot use Intra-BL prediction nor residual prediction.

An entropy encoder 640 losslessly encodes the quantization coefficient to produce an FGS layer bitstream. Similarly, an entropy encoder 540 losslessly encodes a quantization coefficient into a base layer bitstream. A multiplexer (Mux) 650 multiplexes the FGS layer bitstream with the base layer bitstream into a bitstream to be sent to a video decoder.

The entropy encoder 640 may include the refinement bit encoder 100 shown in FIG. 3. The entropy encoder 640 functioning as the refinement bit encoder 100 performs lossless coding on quantization coefficients of FGS layers, specifically zero coefficients, that is, refinement bits, of a corresponding discrete layer. In this case, the entropy encoder 640 receives refinement bits contained in a unit region from the quantizer 630.

Figure 6:
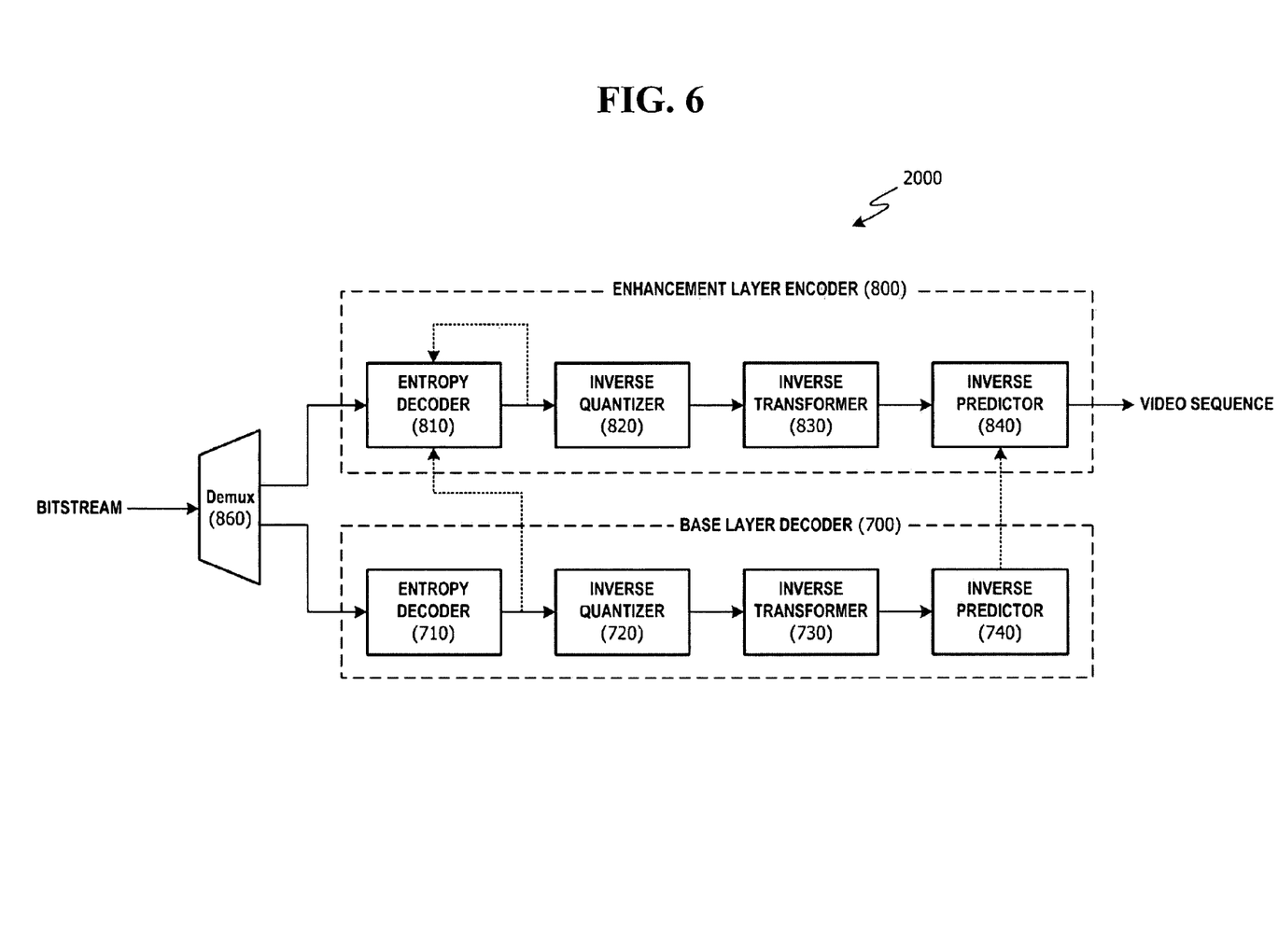
FIG. 6 is a block diagram of an FGS video decoder in which an entropy decoder shown in FIG. 4 may be employed.

FIG. 6 is a block diagram of an FGS video decoder 2000 in which an entropy decoder as shown in FIG. 4 can be employed.

Input bitstreams are separated into an FGS bitstream and a base layer bitstream by a demultiplexer (Demux) 860 to then be supplied to an enhancement layer decoder 800 and a base layer decoder 700, respectively.

An entropy decoder 810 performs a lossless decoding operation by a counterpart method used in the entropy encoder 640 to decode a quantization coefficient.

An inverse quantizer 820 inversely quantizes the decoded quantization coefficient according to a quantization step used by the quantizer 630.

An inverse transformer 830 inversely transforms the inversely quantized coefficient using an inverse transform technique such as inverse DCT or inverse wavelet.

An inverse predictor 840 obtains a predicted image by means of the same technique used by the predictor 610 and adds the predicted image to the inversely transformed result to decode a video sequence.

The base layer decoder 700 may include an entropy decoder 710, an inverse quantizer 720, an inverse transformer 730, and an inverse predictor 740 having the same functions as their counterparts in the enhancement layer decoder 800.

The entropy decoder 810 may include the refinement bit decoder 200 shown in FIG. 4. The entropy decoder 810 functioning as the refinement bit decoder 200 performs lossless coding on quantization coefficients of FGS layers, specifically zero coefficients, that is, refinement bits, of a corresponding discrete layer. In this case, the entropy decoder 810 uses refinement bits contained in a previously entropy-decoded unit region.

The components shown in FIGS. 2 through 6 may be implemented in software such as a task, class, sub-routine, process, object, execution thread or program, which is performed on a certain memory area, and/or hardware such as Field Programmable Gate Array (FPGA) or Application Specific Integrated Circuit (ASIC). The components may also be implemented in a combination of software and hardware. Further, the components may advantageously be configured to reside on computer-readable storage media, or to execute on one or more processors.

As described above, the present invention can enhance the performance of entropy coding in a multilayer-based codec system, thereby providing for an improved video quality in a given quantity of bits.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A variable length coding method for lossless-coding first coefficients among coefficients of a discrete layer and one or more fine granular scalability (FGS) layers, the method comprising:

determining a proportion of zeros included in a predetermined unit region to which the first coefficients belong;

selecting one of a plurality of grouping units depending on whether or not the proportion exceeds a predetermined threshold;

grouping absolute values of the first coefficients using the selected grouping unit; and transforming the grouped absolute values into a code word mapped thereto by referring to a VLC table corresponding to the selected grouping unit.

2. The variable length coding method of claim 1, wherein coefficients of the discrete layer corresponding to the first coefficients are non-zero coefficients.

3. The variable length coding method of claim 2, wherein the first coefficients have one value among −1, 0 and 1.

4. The variable length coding method of claim 1, further comprising coding a symbol of any non-zero coefficient among the first coefficients.

5. The variable length coding method of claim 1, wherein the number of the plurality of grouping units equals one plus the value of the predetermined threshold.

6. The variable length coding method of claim 1, further comprising interleaving the selected grouping unit into bitstreams forming the transformed code word.

7. The variable length coding method of claim 1, wherein the unit region is one selected from the group consisting of a frame, a slice, a macroblock, and a block.

8. The variable length coding method of claim 1, wherein the plurality of grouping units numbers 3 or 4.

9. A variable length decoding method for decoding first coefficients of a granular scalability (FGS) layer in input bitstreams by losslessly decoding a first bitstream of the FGS layer, the method comprising:

determining a proportion of zeros included in previously decoded second coefficients in a predetermined unit region to which the first coefficients belong;

selecting one of a plurality of grouping units depending on whether or not the proportion exceeds a predetermined threshold; and decoding the first coefficients from a code word included in the first bitstream by referring to a VLC table corresponding to the selected grouping unit.

10. The variable length decoding method of claim 9, wherein the decoding of the first coefficients comprises:
  decoding absolute values of the first coefficients corresponding to the code word; and
  decoding symbols from the code word included in the first bitstream and adding the decoded symbols to the absolute values of the first coefficients to decode the first coefficients.

11. The variable length decoding method of claim 9, wherein the first coefficients are refinement bits.

12. The variable length decoding method of claim 9, wherein the first coefficients have one value among −1, 0 and 1.

13. The variable length decoding method of claim 9, wherein the number of the plurality of grouping units equals one plus the value of the predetermined threshold.

14. The variable length decoding method of claim 9, wherein the unit region is one selected from the group consisting of a frame, a slice, a macroblock, and a block.

15. A variable length decoding method for decoding refinement coefficients of a granular scalability (FGS) layer in input bitstreams by losslessly decoding a first bitstream of the FGS layer, the method comprising:
  reading information about a grouping unit interleaved into the first bitstream for each predetermined unit region;
  fetching a VLC table corresponding to the grouping unit; and
  decoding the first coefficients from a code word included in the first bitstream by referring to the VLC table corresponding to the group unit.

16. The variable length decoding method of claim 15, wherein the unit region is one selected from the group consisting of a frame, a slice, a macroblock, and a block.

17. A variable length coding apparatus for lossless-coding first coefficients among coefficients of a discrete layer and one or more fine granular scalability (FGS) layers, the apparatus comprising:
  a portion that determines a proportion of zeros included in a predetermined unit region to which the first coefficients belong;
  a portion that selects one of a plurality of grouping units depending on whether or not the proportion exceeds a predetermined threshold;
  a portion that groups absolute values of the first coefficients using the selected grouping unit; and
  a portion that transforms the grouped absolute values into a code word mapped thereto by referring to a VLC table corresponding to the group unit.

18. A variable length decoding apparatus for decoding first coefficients of a granular scalability (FGS) layer in input bitstreams by losslessly decoding a first bitstream of the FGS layer, the apparatus comprising:
  a portion that determines a proportion of zeros included in previously decoded second coefficients in a predetermined unit region to which the first coefficients belong;
  a portion that selects one of a plurality of grouping units depending on whether or not the proportion exceeds a predetermined threshold; and
  a portion that decodes the first coefficients from a code word included in the first bitstream by referring to a VLC table corresponding to the selected group unit.

* * * * *